(12) United States Patent
Watt et al.

(10) Patent No.: US 7,142,009 B1
(45) Date of Patent: Nov. 28, 2006

(54) ADAPTIVE POWER SUPPLY VOLTAGE REGULATION FOR PROGRAMMABLE LOGIC

(75) Inventors: Jeffrey Watt, Palo Alto, CA (US); Irfan Rahim, San Jose, CA (US)

(73) Assignee: Altera Corporation, San Jose, CA (US)

( * ) Notice: Subject to any disclaimer, the term of this patent is extended or adjusted under 35 U.S.C. 154(b) by 63 days.

(21) Appl. No.: 10/942,692

(22) Filed: Sep. 15, 2004

(51) Int. Cl.
*H03K 19/173* (2006.01)
*G06F 1/26* (2006.01)

(52) U.S. Cl. .................. 326/38; 713/320; 713/340; 713/321

(58) Field of Classification Search ............... 713/200, 713/600
See application file for complete search history.

(56) References Cited

U.S. PATENT DOCUMENTS 6,791,157 B1 * 9/2004 Casto et al. ............. 257/529
2002/0104031 A1 * 8/2002 Tomlinson et al. ......... 713/320
2002/0120882 A1 * 8/2002 Sarangi et al. ............. 713/600

OTHER PUBLICATIONS

"Optimized Multi-Phase PWM Controller with 6-bit DAC and Programmable Internal Temperature Compensation for VR10.X Application," product data sheet Intersil Americas Inc. Milpitas, CA (May 2004).

* cited by examiner

*Primary Examiner*—Vibol Tan
(74) *Attorney, Agent, or Firm*—Townsend and Townsend and Crew LLP

(57) ABSTRACT

Adaptive regulated power supply voltages are applied to programmable logic integrated circuits. Control circuitry in a programmable logic IC generates control signals that are transmitted to an external voltage regulator. The voltage regulator generates one or more power supply voltages in response to the control signals. The values of control signals determine the target values of the supply voltages. The control circuitry can adapt the power supply voltages to compensate for temperature and process variations on the IC. The power supply voltages can be programmed by a manufacturer or by a user to achieve desired target values. The control circuitry can also put a programmable logic IC into a sleep mode by dropping the high supply voltage to a low value to reduce power consumption during periods of low usage.

31 Claims, 6 Drawing Sheets

ADAPTIVE POWER SUPPLY VOLTAGE REGULATION FOR PROGRAMMABLE LOGIC

BACKGROUND OF THE INVENTION

The present invention relates to adaptive power supply voltage regulation for programmable logic, and more particularly, to techniques for providing regulated power supply voltages to programmable logic integrated circuits that can be adapted to compensate for process and temperature variations, or other factors.

Programmable logic devices (PLDs) and field programmable gate arrays (FPGAs) typically receive a power supply voltage ($V_{CC}$) from an external voltage regulator. The voltage regulator provides a fixed regulated voltage that is based on a target value. The power supply voltage is distributed to circuits inside the PLD/FPGA.

Process variations effect the speed and power consumption of transistors in a PLD significantly. For example, when hundreds of PLDs are mass produced according to a particular semiconductor process, the goal is for all of the a PLDs to be identical. In reality, transistors in some of the PLDs end up having shorter gate lengths than the transistors in other PLDs because of variations in the process.

The PLDs that have short gate length transistors operate faster than the PLDs that have longer gate length transistors. The faster chips consume more power than the slower chips. Typically, PLD chips are grouped into bins after manufacture based on their individual speed and power consumption characteristics. A customer can then select a PLD with particular speed and power requirements from one of the bins.

However, customer demand sometimes does not match the bin distribution of the PLDs. For example, a manufacturing process may generate a larger number of slow speed PLDs than customers want to purchase. Also, a customer has no way of controlling the speed and power consumption of a particular PLD.

Because the external voltage regulator generates fixed supply voltages, the supply voltages cannot be used to optimize the speed or power of an individual PLD. Therefore, some PLD die may have to be discarded if their speed parameters and power consumption is outside predefined limits. The contribution of current leakage adds an additional criteria to power consumption on a PLD. Also, process variations are excepted to become more significant as transistor sizes are scaled down further.

Therefore, it would be desirable to provide techniques for providing regulated power supply voltages to programmable logic integrated circuits that can be adapted to compensate for process and temperature variations, or factors.

BRIEF SUMMARY OF THE INVENTION

The present invention provides regulated power supply voltages to programmable logic integrated circuits (ICs). Control circuitry in a programmable logic IC generates control signals that are transmitted to an external voltage regulator. The voltage regulator generates one or more power supply voltages in response to the control signals. The values of control signals determine the target values of the supply voltages.

The control circuitry can adapt the power supply voltages to compensate for temperature and process variations on the programmable logic IC or other parameters. The power supply voltages can be programmed by a manufacturer or by a user to achieve desired target values. The control circuitry can also put a programmable logic IC, or a portion thereof, into sleep mode by dropping the high supply voltage to a low value to reduce power consumption during periods of low usage.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
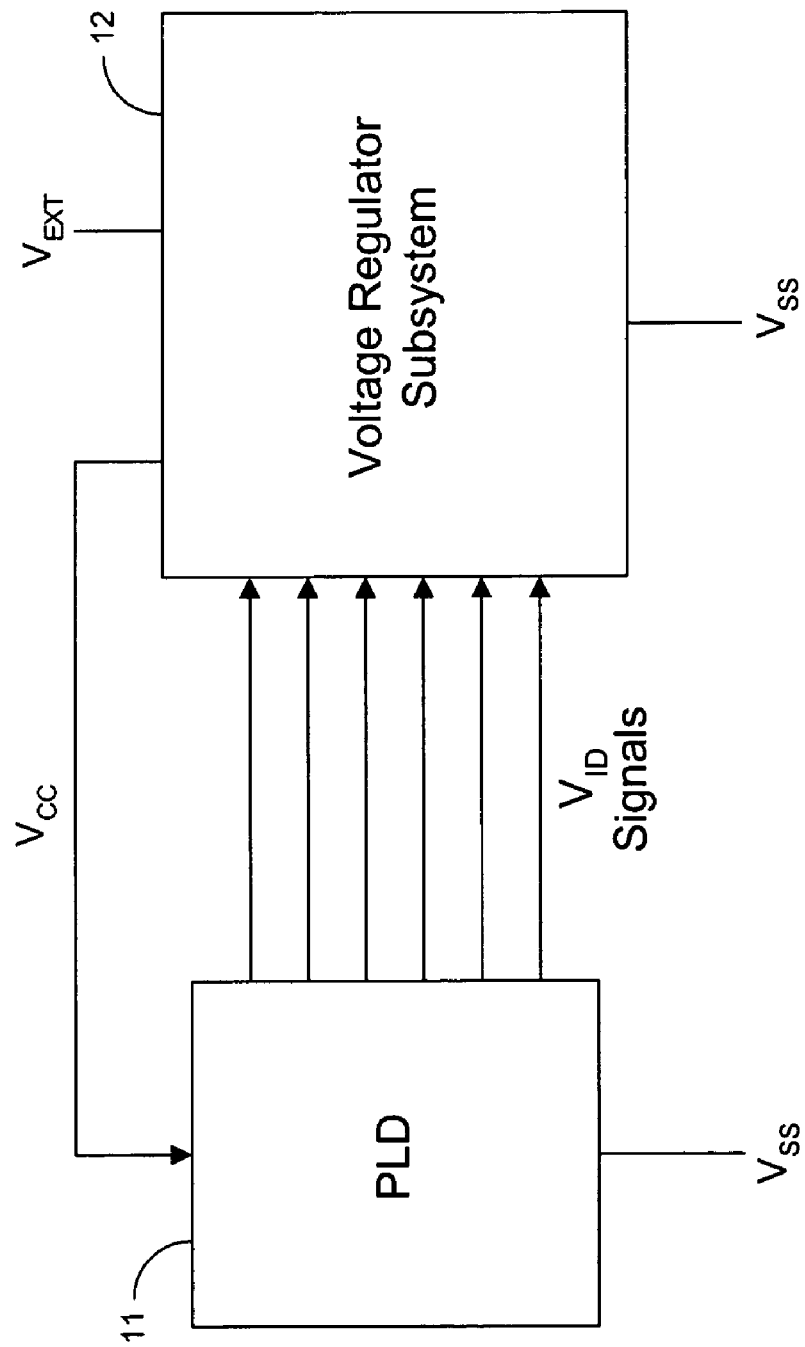
FIG. 1 illustrates an adaptive power supply voltage regulation system for a programmable logic device according to an embodiment of the present invention.

FIG. 1 illustrates an adaptive power supply voltage regulation system for PLD 11 according to an embodiment of the present invention. PLD 11 has control circuitry that generates a plurality of digital control signals $V_{ID}$. The control signals are transmitted to voltage regulator subsystem 12 that is external to PLD 11.

Voltage regulator subsystem 12 receives an input voltage $V_{EXT}$ and generates a regulated output voltage $V_{CC}$. Voltage $V_{CC}$ is transmitted to PLD 11, which uses $V_{CC}$ as a supply voltage. Regulator subsystem 12 determines a target value for $V_{CC}$ based on the digital values of control signals $V_{ID}$.

The Intersil ISL6556B controller is an example of a chip that can be used to implement to regulator subsystem 12. The ISL6556B is a multi-phase pulse width modulated (PWM) controller. The ISL6556B has a digital-to-analog converter that converts six digital $V_{ID}$ signals into an analog voltage. The analog voltage determines a reference voltage for an error amplifier. The output signal of the error amplifier sets the pulse width modulated output signals of four PWM comparators. The four PWM comparators control four voltage regulator chips that generate the supply voltage.

Figure 2:
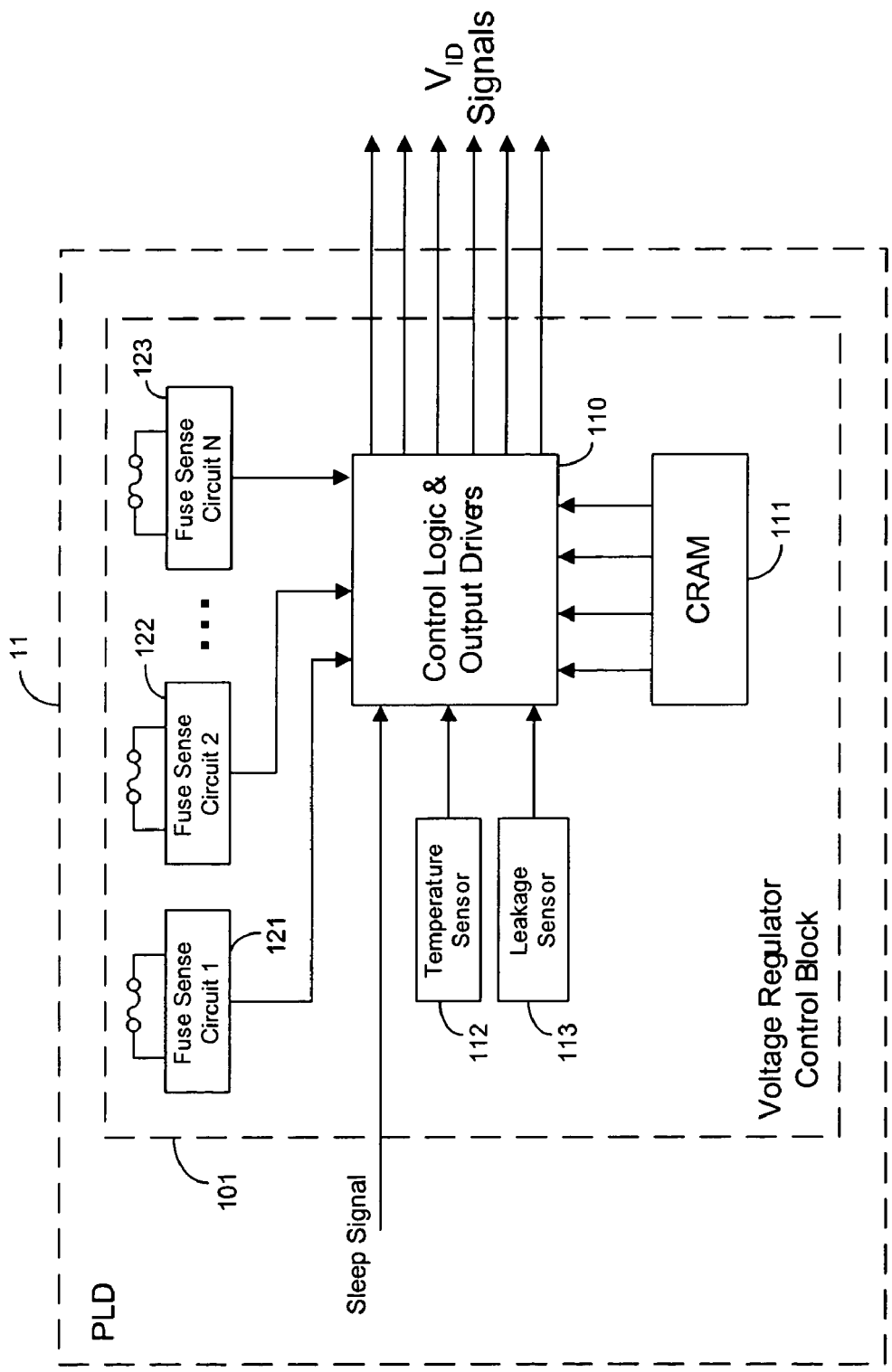
FIG. 2 illustrates a control block on a programmable logic device generating control signals that control the supply voltage values generated by an external voltage regulator according to an embodiment of the present invention.

Control circuitry in PLD 11 generates particular values for control signals $V_{ID}$ in order to receive a specific voltage value for $V_{CC}$. FIG. 2 illustrates a specific embodiment of a flexible control block 101 that generates control signals $V_{ID}$. PLD 11 includes control block 101, programmable logic, and other circuitry (not shown). Control block 101 has several fuse sense circuits 121–123. Each of the fuse sense circuits is coupled to a fuse. Control block 101 also has a temperature sensor circuit 112, a current leakage sensor circuit 113, and configurable RAM (CRAM) block 111.

The fuse sense circuits, the temperature sensor, the leakage sensor, and the CRAM generate output signals that are transmitted to control logic 110. Control logic 110 also receives an sleep signal from the programmable logic (or another source). The control logic 110 generates $V_{ID}$ signals in response to the output signals of the fuse sense, temperature, leakage, sleep, and CRAM signals. These are merely a few examples of the types of input signals that can be applied to control logic 110 to control the $V_{ID}$ signals. Other types of input signals can also be applied to control logic 110 to control the $V_{ID}$ signals.

Control logic 110 may, for example, comprise a finite state machine that corresponds each set of $V_{ID}$ values with each possible set of input signals. Another example of control logic 110 is a lookup table. The lookup table stores the possible values for the $V_{ID}$ signals and outputs one set of stored values in response to the signals received from the sensors and the CRAM circuit. Output drivers coupled to the control logic drive the $V_{ID}$ signals to external voltage regulator 12.

Fuse sense circuits 121–123 have been placed in control block 101 so that the supply voltage $V_{CC}$ can be adjusted after the PLD has been manufactured to compensate for process variations. Process variations can effect the speed and power consumption of transistors on a PLD. The speed and power consumption of a PLD can be measured after manufacture, and then one or more fuses can be blown to adjust the power supply voltage.

Adjusting the power supply voltage can compensate for variations in transistor speed and power consumption that are caused by process variations. For example, if process variations cause transistors on a PLD to operate slowly, one or more of the fuses are blown. Fuse sense circuits 121–123 sense which of the fuses are blown and generate output signals in response to the states of the fuses. Control logic 110 changes the values of control signals $V_{ID}$ to cause regulator 12 to increase the supply voltage $V_{CC}$. Transistors switch faster at greater supply voltages. More fuses can be blown to generate a greater supply voltage. Alternatively, blowing more fuses can cause a lower supply voltage.

The fuses can be on-chip fuses or off-chip fuses. The fuses can be, for example, electrical fuses or laser fuses. An electrical fuse can be fabricated on a semiconductor die, for example, on a metal or polysilicon layer. An electrical fuse is blown by driving a large current through the fuse. A laser fuse is blown by a laser. Other types of fuses and methods of storing data can be used as well. According to further embodiments, memory elements or anti-fuses can be used in place of the fuses.

PLD 11 (or an external source) generates a sleep signal, which is transmitted to control logic 110. The sleep signal indicates when the PLD has entered a period of low usage. During the low usage period, power consumption can be reduced in PLD 11 by dropping the high supply voltage $V_{CC}$ to a low value. When $V_{CC}$ is at a low value, leakage current in PLD 11 is substantially reduced. When the sleep signal is generated, control logic 110 generates new values for one or more of the $V_{ID}$ signals. In response to receiving the new values of the $V_{ID}$ signals, regulator subsystem 12 decreases $V_{CC}$ to a low value.

Temperature sensor 112 has circuitry that senses the temperature of PLD 11. Sensor 112 generates one or more output signals that vary as the temperature of the IC varies. Leakage sensor 113 has circuitry that senses the leakage current on the IC. Sensor 113 generates one or more output signals that vary as the leakage current on PLD 11 varies. Control logic 110 varies the values of the $V_{ID}$ signals when the output signals of the temperature or leakage sensors change in order to change the supply voltages to compensate for the effects of temperature and leakage variations.

For example, as the temperature of the IC increases, the transistors operate more slowly. If an output signal of temperature sensor 112 reflects the temperature change, control logic 110 can change the values of the $V_{ID}$ signals to increase $V_{CC}$ so that the transistors operate faster. As another example, when the leakage current on an IC is high, power consumption increases. If an output signal of leakage sensor 113 reflects a high leakage current, control logic 10 can generate values for the $V_{ID}$ signals that decrease $V_{CC}$ to reduce power consumption.

Configurable RAM block 111 contains random access memory (RAM) cells that can be configured by a PLD customer or supplier. For example, a PLD supplier can provide software to generate the configuration data stored in CRAM 111. A supplier can build in configuration settings that are invisible to the customer to control the power supply voltage.

CRAM 111 generates output signals that are also used by control logic 110 to generate the values of the $V_{ID}$ signals. A PLD user can store data bits in the CRAM memory cells in order to control the values of the supply voltages to meet user-specific design requirements.

For example, if a user wants PLD 11 to have higher speed transistors, the user can store selected bit values in CRAM block 111. The selected bit values are transmitted to control logic 110, which adjusts signals $V_{ID}$. The $V_{ID}$ signals are changed in response to the CRAM bits to cause $V_{CC}$ to increase so that transistors in PLD 11 operate faster.

The CRAM can also be used to control how the control logic 110 responds to the temperature sensor, the leakage sensor, the fuses, or any other inputs to the control logic. For example, the control logic can use the CRAM bits to determine how fast to increase the $V_{ID}$ signals as the temperature increases or as the leakage increases. As another example, the CRAM bits can set maximum or minimum values for the $V_{ID}$ signals, which correspond to minimum and maximum $V_{CC}$ values.

Figure 3:
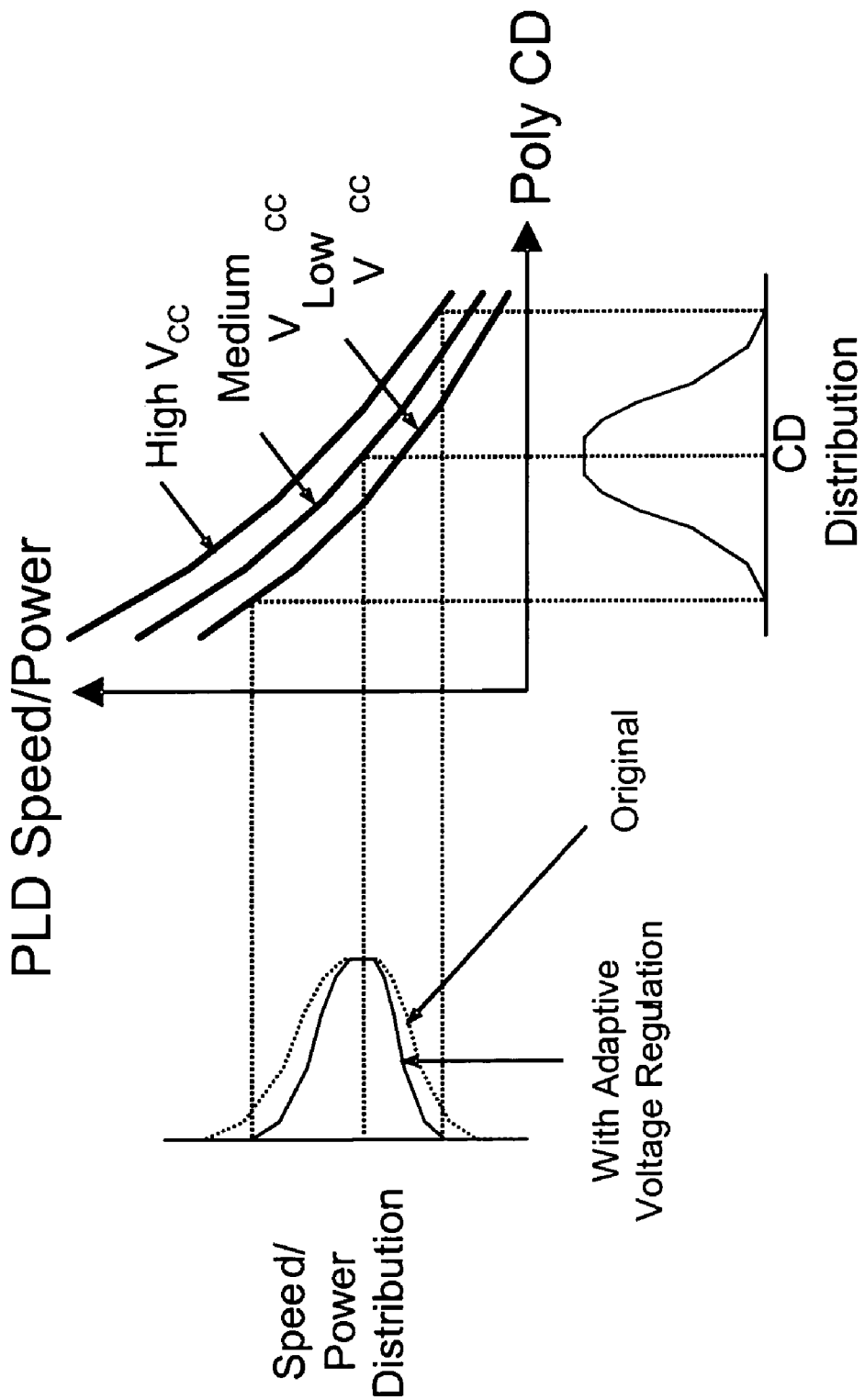
FIG. 3 is a graph that illustrates examples of speed and power distributions for an adaptive power supply voltage regulation system of the present invention.

FIG. 3 is a graph that illustrates examples of how an adaptive supply voltage $V_{CC}$ can effect the speed and power consumption on a PLD according to the present invention. Curves for three different $V_{CC}$ values are shown in FIG. 3 (high, medium, and low $V_{CC}$). The curves are plotted for PLD speed or power (y-axis) versus the critical dimension of the polysilicon (x-axis). The critical dimension is usually the transistor gate length.

A speed or power distribution graph is shown on the left. This graph corresponds to a particular critical dimension distribution that is plotted in a third graph labeled CD Distribution. The critical dimension distribution in a batch of PLDs is caused by process variations. The process variations cause the critical dimensions within the PLDs to be different.

For PLDs in the batch that have small critical dimensions, the fuses are set to generate a low $V_{CC}$ to reduce speed and power consumption. For PLDs in the batch that have larger critical dimensions, the fuses are set to generate a larger value for $V_{CC}$ to increase speed and power consumption. As can be seen in speed/power distribution graph, the adaptive voltage techniques of the present invention provide narrower speed and power distribution than a fixed supply voltage (shown by the original curve). Alternatively, the entire speed and power distribution can be shifted up or down to optimize speed and power requirements or to satisfy customer demands.

Figure 4A:
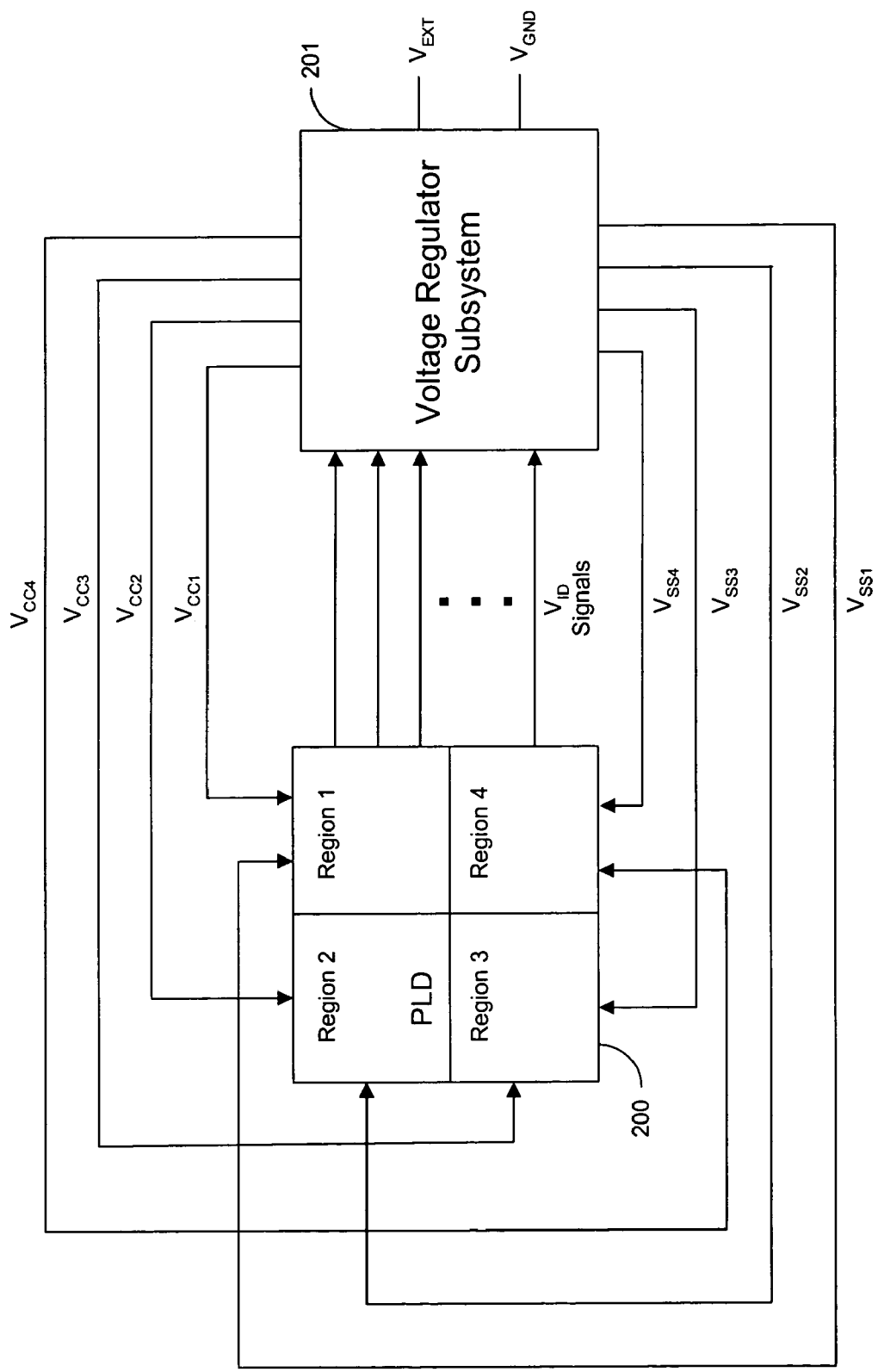
FIGS. 4A–4C illustrate adaptive power supply voltage regulation systems that generate multiple supply voltages according to further embodiments of the present invention.

FIG. 4A illustrates an adaptive supply voltage regulation system that generates multiple supply voltages according to another embodiment of the present invention. PLD 200 transmits multiple $V_{ID}$ control signals to external voltage regulator subsystem 201, as described above with respect to the previous embodiment. Voltage regulator subsystem 201 generates four high supply voltages $V_{CC1}$, $V_{CC2}$, $V_{CC3}$, and $V_{CC4}$ and four low supply voltages $V_{SS1}$, $V_{SS2}$, $V_{SS3}$, and $V_{SS4}$. PLD 200 generates enough digital $V_{ID}$ signals so that regulator 201 can decode them into analog values for all 8 supply voltages.

The supply voltages generated by regulator 201 are applied to different regions of PLD 200. Specifically, high supply voltages $V_{CC1}$, $V_{CC2}$, $V_{CC3}$, and $V_{CC4}$ are applied to regions 1, 2, 3, and 4 of PLD 200, respectively. Low supply voltages $V_{SS1}$, $V_{SS2}$, $V_{SS3}$, and $V_{SS4}$ are applied to regions 1, 2, 3, and 4 of PLD 200, respectively. The four low supply voltages are used as ground in the respective regions of the PLD. Any desired number of supply voltages can be generated and applied to different regions of PLD 200.

The embodiment of FIG. 4A may be useful for a variety of applications. For example, a user design for a PLD may have a fast portion and a slow portion. In the fast portion of the design, the transistors need to operate quickly to satisfy strict timing constraints. In the slow portion of the design, reducing power consumption is more critical than achieving optimal transistor speed. In the prior art, only one supply voltage was applied to the core region of the PLD that contains the programmable logic. The present invention allows a user to apply different supply voltages to fast and slow regions within the programmable logic core of a PLD chip, as shown in FIG. 4A.

As described above, control block 101 can generate a sleep mode during which the high power voltage $V_{CC}$ is significantly reduced to save power. Some types of volatile memory cells need a particular supply voltage value to retain their stored memory states. During sleep mode, these volatile memory cells may lose their stored values when the supply voltage decreases.

Providing multiple supply voltages to a PLD is also useful for implementing sleep mode. For example, one of the supply voltages (e.g., $V_{CC1}$) can be applied to a region of PLD 200 that contains volatile memory (region 1). During sleep mode, regulator 201 drops the supply voltages ($V_{CC2}$, $V_{CC3}$, and $V_{CC4}$) for regions 2–4 to a low value, while maintaining the supply voltage $V_{CC1}$ for region 1 at a constant value. This technique allows the volatile memory cells in region 1 to continuously receive the full supply voltage so that stored data values are retained. At the same time, other circuitry on the PLD can receive a lowered supply voltage during sleep mode.

Regulator 201 also generates a low supply voltages $V_{SS1\text{-}4}$ that correspond to ground. Regulator 201 adjusts low supply voltages in response to changes in signals $V_{ID}$. Control block 101 can adjust the low supply voltages in response to temperature, leakage, the CRAM bits or the states of the fuses. $V_{SS}$ can actually be a negative, zero, or a positive voltage value. Low supply voltages $V_{SS}$ can have different voltage values. The different values of the $V_{SS}$ signals are determined by the $V_{ID}$ signals as described above.

Figure 4B:
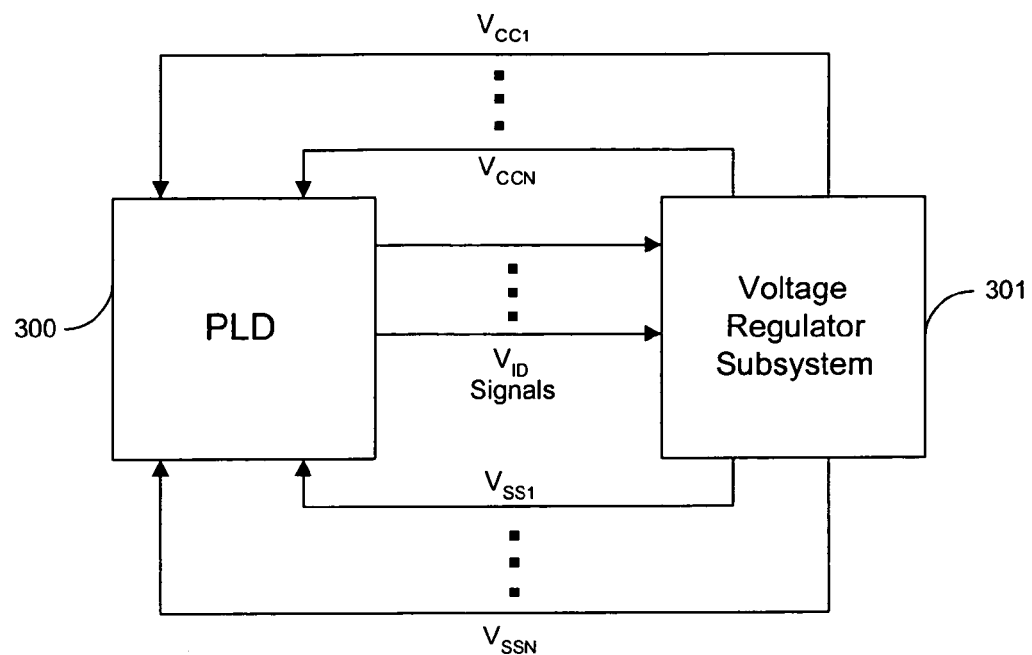

FIG. 4B illustrates another embodiment of an adaptive supply voltage regulation system that generates multiple supply voltages. PLD 300 generates multiple control signals $V_{ID}$ that are transmitted to inputs of voltage regulator subsystem 301, as with the previous embodiments. Voltage regulator 301 generates multiples high supply voltages $V_{CC1}$–$V_{CCN}$ and multiple low supply voltages $V_{SS1}$–$V_{SSN}$ in response to the $V_{ID}$ signals. The high and low supply voltages are transmitted to PLD 300. PLD 300 can distribute the high and low supply voltages to any region of the PLD. The supply voltages are not confined to a sub-region of the PLD, as with the embodiment of FIG. 4A.

Figure 4C:
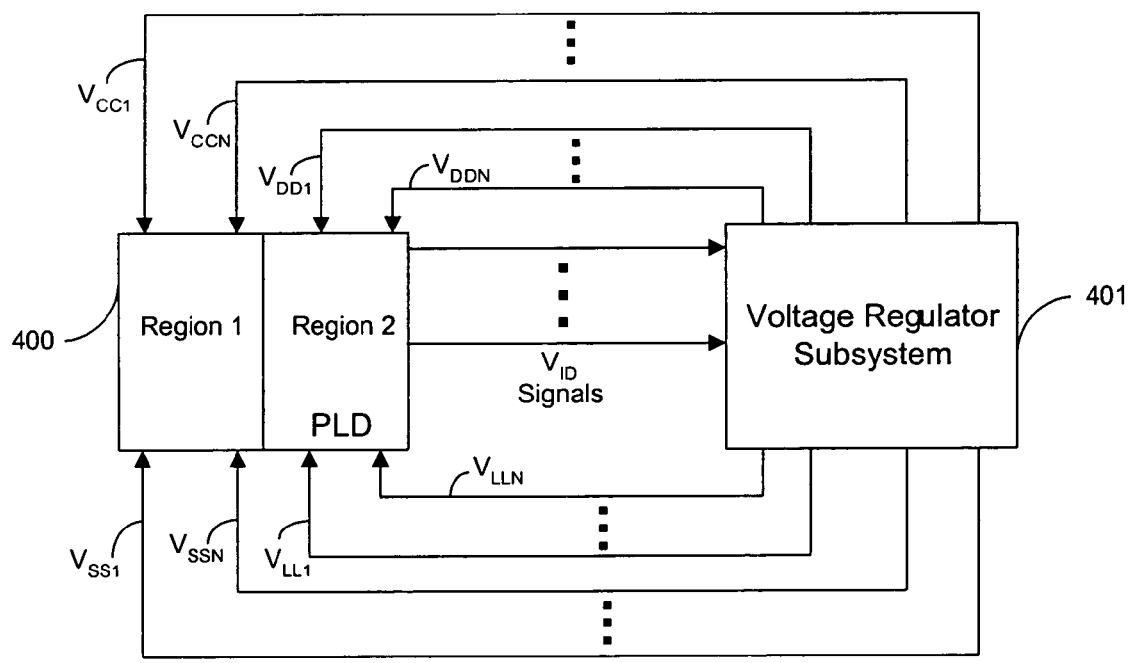

FIG. 4C illustrates yet another embodiment of an adaptive supply voltage regulation system that generates multiple supply voltages. PLD 400 generates multiple control signals $V_{ID}$ that are transmitted to inputs of voltage regulator subsystem 401, as with the previous embodiments. Voltage regulator 401 generates multiple high supply voltages $V_{CC1}$–$V_{CCN}$ and $V_{DD1}$–$V_{DDN}$ in response to the $V_{ID}$ signals. Subsystem 401 also generates multiple low supply voltages $V_{SS1}$–$V_{SSN}$ and $V_{LL1}$–$V_{LLN}$ in response to the $V_{ID}$ signals.

The high and low supply voltages are transmitted to PLD 400. High supply voltages $V_{CC1}$–$V_{CCN}$ and low supply voltages $V_{SS1}$–$V_{SSN}$ are only distributed within region 1 of PLD 400. High supply voltages $V_{DD1}$–$V_{DDN}$ and low supply voltages $V_{LL1}$–$V_{LLN}$ are only distributed within region 2 of PLD 400.

Figure 5:
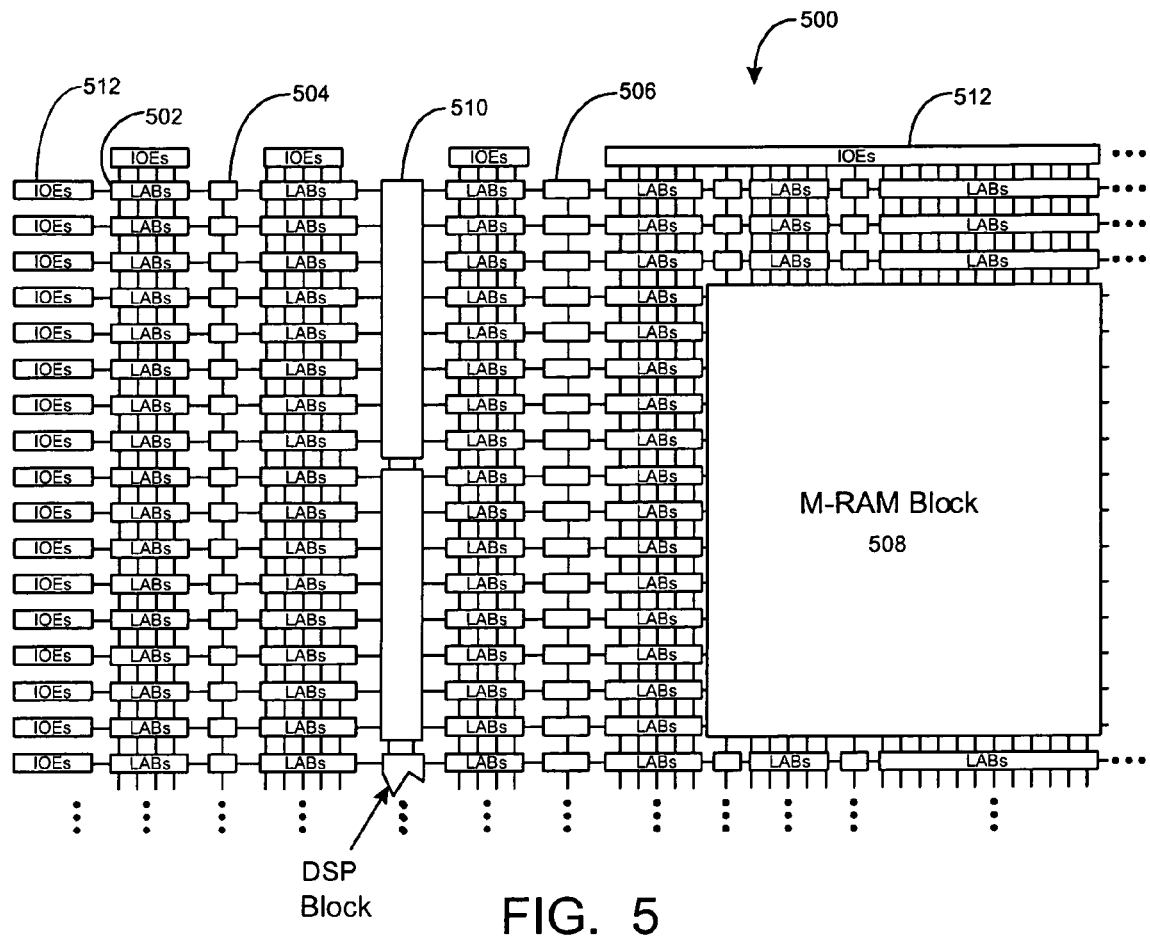
FIG. 5 is a simplified block diagram of a programmable logic device that can be used with the techniques of the present invention.

FIG. 5 is a simplified partial block diagram of an example of a PLD 500. PLD 500 is an example of a programmable logic integrated circuit for which techniques of the present invention can be implemented. It should be understood that the present invention can be used to select from among numerous types of programmable integrated circuits. Programmable logic ICs also include FPGAs, PLAs, CPLDs, etc. PLD 500 includes a two-dimensional array of programmable logic array blocks (or LABs) 502 that are interconnected by a network of column and row interconnects of varying length and speed. LABs 502 include multiple (e.g., 10) logic elements (or LEs).

An LE is a programmable logic block that provides for efficient implementation of user defined logic functions. PLD 500 has numerous logic elements that can be configured to implement various combinatorial and sequential functions. The logic elements have access to a programmable interconnect structure. The programmable interconnect structure can be programmed to interconnect the logic elements in almost any desired configuration.

PLD 500 also includes a distributed memory structure including RAM blocks of varying sizes provided throughout the array. The RAM blocks include, for example, 512 bit blocks 504, 4K blocks 506, and a block 508 that provides 512K bits of RAM. These memory blocks can also include shift registers and FIFO buffers.

PLD 500 further includes digital signal processing (DSP) blocks 510 that can implement, for example, multipliers with add or subtract features. I/O elements (IOEs) 512 located, in this example, around the periphery of the device support numerous single-ended and differential I/O standards. It is to be understood that PLD 500 is described herein for illustrative purposes only and that the present invention can be evaluate many different types of PLDs, FPGAs, and the like.

Figure 6:
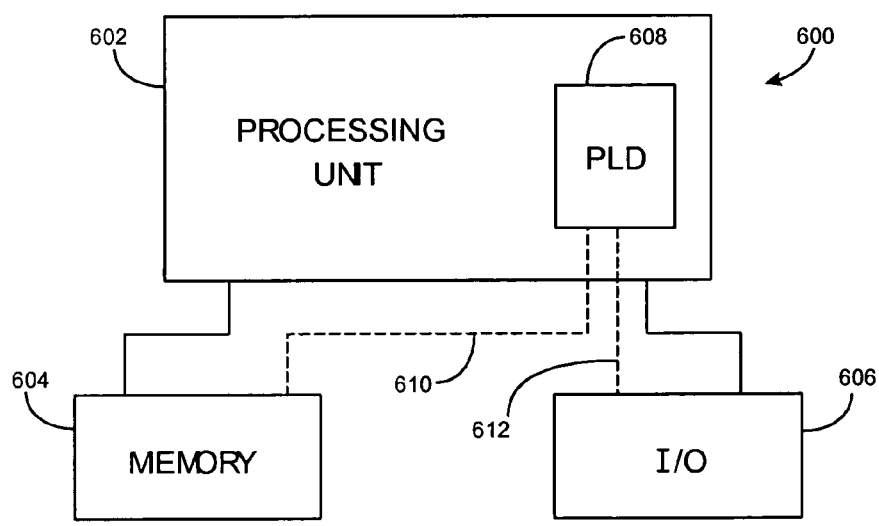
FIG. 6 is a block diagram of an electronic system that can implement embodiments of the present invention.

While PLDs of the type shown in FIG. 5 provide many of the resources required to implement system level solutions, the present invention can also benefit systems wherein a PLD is one of several components. FIG. 6 shows a block diagram of an exemplary digital system 600, for which the present invention can be implemented. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604 and an I/O unit 606 interconnected together by one or more buses. According to this exemplary embodiment, a programmable logic device (PLD) 608 is embedded in processing unit 602. PLD 608 can serve many different purposes within the system in FIG. 6. PLD 608 can, for example, be a logical building block of processing unit 602, supporting its internal and external operations. PLD 608 is programmed to implement the logical functions necessary to carry on its particular role in system operation. PLD 608 can be specially coupled to memory 604 through connection 610 and to I/O unit 606 through connection 612.

Processing unit 602 can direct data to an appropriate system component for processing or storage, execute a program stored in memory 604 or receive and transmit data via I/O unit 606, or other similar function. Processing unit 602 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 608 can control the logical operations of the system. In an embodiment, PLD 608 acts as a reconfigurable processor, which can be reprogrammed as needed to handle a particular computing task. Alternately, programmable logic device 608 can itself include an embedded microprocessor. Memory unit 604 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A programmable logic integrated circuit comprising:
   programmable logic circuits;
   a sensor circuit that generates a sense signal; and
   control logic generating control signals in response to the sense signal and a program signal adapted to control the control signals,
   wherein the control signals are transmitted to an external voltage regulator that generates a supply voltage in response to the control signals, the supply voltage is provided to the programmable logic integrated circuit, and voltages of the control signals are used to determine the supply voltage.

2. The programmable logic integrated circuit defined in claim 1 wherein the sensor circuit is a temperature sensor that senses a temperature on the programmable logic integrated circuit.

3. The programmable logic integrated circuit defined in claim 1 wherein the sensor circuit is a leakage sensor that senses leakage current on the programmable logic integrated circuit.

4. The programmable logic integrated circuit defined in claim 1 wherein the sensor circuit is a fuse sense circuit that senses a state of a fuse.

5. The programmable logic integrated circuit defined in claim 4 further comprising:
   a plurality of fuse sense circuits that generate fuse sense signals in response to sensing fuses, and the control logic generates the control signals in response to the fuse sense signals.

6. The programmable logic integrated circuit defined in claim 1 wherein the sensor circuit is an anti-fuse sense circuit that senses a state of an anti-fuse.

7. The programmable logic integrated circuit defined in claim 1 wherein the control logic has an input for receiving a sleep signal, the sleep signal indicating when to reduce the supply voltage to place at least a portion of the programmable logic integrated circuit into a lower power sleep mode.

8. The programmable logic integrated circuit defined in claim 1 further comprising:
   configurable RAM that can be programmed by a user or by a supplier of the programmable logic integrated circuit, the configurable RAM generating output signals,
   wherein the control logic uses the output signals of the configurable RAM and the sense signal to generate the control signals.

9. The programmable logic integrated circuit defined in claim 1 wherein the external voltage regulator generates first and second supply voltages in response to the control signals generated by the control logic, and the first and the second supply voltages are distributed throughout the programmable logic integrated circuit.

10. The programmable logic integrated circuit defined in claim 1 wherein the programmable logic integrated circuit has a first region that receives a first supply voltage and a second region that receives a second supply voltage,
    and the external voltage regulator generates the first and the second supply voltages in response to the control signals generated by the control logic.

11. The programmable logic integrated circuit defined in claim 10 wherein the fast region receives a third supply voltage and the second region receives a fourth supply voltage,
    and the external voltage regulator generates the third and the fourth supply voltages in response to the control signals.

12. The programmable logic integrated circuit defined in claim 10 wherein the programmable logic integrated circuit has a third first region that receives a third supply voltage,
    and the external voltage regulator generates the third supply voltage in response to the control signals generated by the control logic.

13. The programmable logic integrated circuit defined in claim 12 wherein the programmable logic integrated circuit has a fourth first region that receives a fourth supply voltage,
    and the external voltage regulator generates the fourth supply voltage in response to the control signals generated by the control logic.

14. The programmable logic integrated circuit defined in claim 10 wherein the external voltage regulator generates a high second supply voltage and a low supply voltage in response to the control signals generated by the control logic.

15. The programmable logic integrated circuit defined in claim 14 wherein the low supply voltage is a negative supply voltage.

16. A method for controlling a supply voltage for a programmable logic integrated circuit, the method comprising:
   generating a sense signal in a sense circuit on the programmable logic integrated circuit;
   generating a plurality of control signals in response to the sense signal using control logic on the programmable integrated logic circuit, and in response to a program signal adapted to control the plurality of control signals;
   generating a supply voltage using an external voltage regulator, wherein the supply voltage is dependent on voltages of the control signals; and
   providing the supply voltage to programmable logic circuits on the programmable logic integrated circuit.

17. The method according to claim 16 wherein generating the sense signal further comprises generating a temperature sense signal in a temperature sense circuit that senses a temperature on the programmable logic integrated circuit.

18. The method according to claim 16 wherein generating the sense signal further comprises generating a leakage sense signal in a leakage sense circuit that senses current leakage on the programmable logic integrated circuit.

19. The method according to claim 16 wherein generating the sense signal further comprises generating a fuse sense signal in a fuse sense circuit that senses a state of a fuse.

20. The method according to claim 16 wherein generating the supply voltage using the external voltage regulator further comprises generating first and second supply voltages using the external voltage regulator.

21. The method according to claim 20 wherein providing the supply voltage to the programmable logic circuits further comprises providing the first supply voltage to a first region of the programmable logic integrated circuit and providing the second supply voltage to a second region of the programmable logic integrated circuit.

22. The method according to claim 20 wherein the first supply voltage is a high supply voltage and the second supply voltage is a low supply voltage.

23. The method according to claim 22 wherein the low supply voltage is a negative supply voltage.

24. The method according to claim 16 further comprising:
   reducing the supply voltage in response to receiving a sleep signal at the control logic to place at least a portion of the programmable logic integrated circuit into a lower power sleep mode.

25. A programmable logic integrated circuit comprising:
   means for providing combinatorial and sequential logic functions; means for generating a sense signal; and
   means for generating control signals in response to the sense signal and in response to a program signal adapted to control the control signals,
   wherein the control signals are transmitted to an external voltage regulator that generates a supply voltage in response to the control signals, the supply voltage is provided to the programmable logic integrated circuit, and voltages of the control signals are used to determine the supply voltage.

26. The programmable logic integrated circuit defined in claim 25 wherein the means for generating the sense signal further comprises means for generating a temperature sense signal.

27. The programmable logic integrated circuit defined in claim 25 wherein the means for generating the sense signal further comprises means for generating a current leakage signal.

28. The programmable logic integrated circuit defined in claim 27 wherein the means for generating the sense signal further comprises means for generating a fuse sense signal.

29. The programmable logic integrated circuit defined in claim 25 wherein the means for generating the control signals in response to the sense signal further comprises means for generating the sense signal in response to a sleep signal to cause the supply voltage to drop to a low value during a low power sleep mode.

30. The programmable logic integrated circuit defined in claim 1, wherein the program signal comprises signals from a configurable random access memory.

31. The programmable logic integrated circuit defined in claim 1, wherein the program signal controls the control signals by controlling the response of the control logic to the sense signal.

* * * * *